United States Patent
Bi et al.

(10) Patent No.: US 11,145,508 B2
(45) Date of Patent: Oct. 12, 2021

(54) FORMING A FIN CUT IN A HARDMASK

(71) Applicant: International Business Machines Corporation, Armonk, NY (US)

(72) Inventors: Zhenxing Bi, Niskayuna, NY (US); Kangguo Cheng, Schenectady, NY (US); Juntao Li, Cohoes, NY (US); Peng Xu, Santa Clara, CA (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/236,811

(22) Filed: Dec. 31, 2018

(65) Prior Publication Data
US 2019/0139764 A1 May 9, 2019

Related U.S. Application Data

(63) Continuation of application No. 15/632,984, filed on Jun. 26, 2017, now Pat. No. 10,262,861, which is a (Continued)

(51) Int. Cl.
*H01L 21/033* (2006.01)
*H01L 21/8234* (2006.01)
(Continued)

(52) U.S. Cl.
CPC ...... *H01L 21/0332* (2013.01); *H01L 21/3083* (2013.01); *H01L 21/3086* (2013.01);
(Continued)

(58) Field of Classification Search
CPC ............. H01L 21/0332; H01L 21/3083; H01L 21/3086; H01L 21/823431;
(Continued)

(56) References Cited

U.S. PATENT DOCUMENTS 6,033,977 A * 3/2000 Gutsche ............ H01L 21/76807
257/E21.579
6,110,837 A 8/2000 Linliu et al.
(Continued)

FOREIGN PATENT DOCUMENTS

CN 1665000 A 9/2005

OTHER PUBLICATIONS

Bi et al., "Forming a Fin Cut in a Hardmask" U.S. Appl. No. 15/275,999, filed Sep. 26, 2016.
(Continued)

*Primary Examiner* — Su C Kim
(74) *Attorney, Agent, or Firm* — Cantor Colburn LLP; Kurt Goudy

(57) ABSTRACT

A method of fabricating a hard mask structure is provided. According to the method, a hard mask layer is disposed over a substrate. The hard mask layer includes a lower hard mask layer disposed over the substrate and an upper hard mask layer disposed over the lower hard mask layer. The hard mask layer is patterned and the upper hard mask layer is removed by selectively etching the upper hard mask layer until reaching the lower hard mask layer to form a top portion of the hard mask structure having a first dimension. A spacer material is disposed on a sidewall of the top portion of the hard mask structure. The lower hard mask layer is removed by selectively etching the lower mask layer until reaching the substrate to form a bottom portion of the hard mask structure having a second dimension.

13 Claims, 11 Drawing Sheets

Related U.S. Application Data continuation of application No. 15/275,999, filed on Sep. 26, 2016, now Pat. No. 9,761,450.

(51) Int. Cl.
  *H01L 29/66* (2006.01)
  *H01L 21/308* (2006.01)
  *H01L 29/78* (2006.01)
  *H01L 29/165* (2006.01)

(52) U.S. Cl.
  CPC ........... *H01L 21/823431* (2013.01); *H01L 29/66795* (2013.01); *H01L 29/165* (2013.01); *H01L 29/6653* (2013.01); *H01L 29/66545* (2013.01); *H01L 29/7851* (2013.01)

(58) Field of Classification Search
  CPC ......... H01L 29/66795; H01L 29/66545; H01L 29/7851; H01L 29/165; H01L 29/6653
  See application file for complete search history.

(56) References Cited

U.S. PATENT DOCUMENTS

| | | | |
|---|---|---|---|
| 6,232,175 B1 | 5/2001 | Liu et al. | |
| 7,060,539 B2 | 6/2006 | Chidambarao et al. | |
| 8,658,536 B1 | 2/2014 | Choi et al. | |
| 8,871,651 B1 | 10/2014 | Choi et al. | |
| 9,034,748 B2 | 5/2015 | Baiocco et al. | |
| 9,093,496 B2 | 7/2015 | Jacob et al. | |
| 9,245,883 B1 | 1/2016 | Lin et al. | |
| 9,318,330 B2 | 4/2016 | Tagami et al. | |
| 9,337,050 B1 | 5/2016 | Xie et al. | |
| 2004/0211754 A1* | 10/2004 | Sreenivasan | B81C 1/0046 216/41 |
| 2007/0158756 A1 | 7/2007 | Dreeskornfeld et al. | |
| 2009/0050951 A1* | 2/2009 | Inaba | H01L 27/105 257/316 |
| 2010/0173493 A1 | 7/2010 | Kushibiki et al. | |
| 2010/0187596 A1 | 7/2010 | Hsieh | |
| 2010/0291476 A1 | 11/2010 | Liu | |
| 2011/0008957 A1* | 1/2011 | Park | H01L 28/60 438/624 |
| 2011/0031004 A1 | 2/2011 | Yugami et al. | |
| 2013/0001750 A1 | 1/2013 | Arnold et al. | |
| 2015/0024572 A1 | 1/2015 | Jacobs et al. | |
| 2015/0279971 A1 | 10/2015 | Xie et al. | |
| 2015/0318215 A1 | 11/2015 | Taylor, Jr. et al. | |
| 2015/0348775 A1* | 12/2015 | Tsai | H01L 21/0274 430/319 |

OTHER PUBLICATIONS

Bi et al., "Forming a Fin Cut in a Hardmask" U.S. Appl. No. 15/632,984, filed Jun. 26, 2017.

List of IBM Patents or Patent Applications Treated as Related; (Appendix P), Date Filed Jan. 22, 2019; 2 pages.

Chong et al.; "Hard Mask profile and loading issue study in SADP process"; China Semiconductor Technology International Conference; 2015; 3 pages.

\* cited by examiner

FORMING A FIN CUT IN A HARDMASK

DOMESTIC PRIORITY

This application is a continuation of U.S. patent application Ser. No. 15/632,984, filed Jun. 26, 2017, which is a continuation of U.S. patent application Ser. No. 15/275,999, filed Sep. 26, 2016, now issued U.S. Pat. No. 9,761,450, the disclosures of which are incorporated by reference herein in their entirety.

BACKGROUND

The present invention generally relates to methods of fabricating a semiconductor device, and more particularly, to methods of fabricating the fin element of a fin-type field effect transistor (finFET).

A known type of metal oxide semiconductor field effect transistors (MOSFET) is a non-planar device known generally as a fin-type field effect transistor (FinFET). The basic electrical layout and mode of operation of a FinFET device does not differ significantly from a traditional field effect transistor (FET). In contrast to a planar MOSFET, however, the source, drain and channel regions of a FinFET are built as a three-dimensional fin/bar on top of a local shallow trench isolation (STI) region and a semiconductor substrate. The gate electrode is wrapped over the top and sides of a middle portion of the fin such that the grate electrode is substantially perpendicular with respect to the fin. This middle portion of the fin, which is under the gate electrode, functions as the channel and provides an increased effective channel width compared to planar MOSFETs. The source and drain regions are the portions of the fin on either side of the channel that are not under the gate electrode. The source and drain regions can be suitably doped to produce the desired FET polarity, as is known in the art. The dimensions of the fin establish the effective channel length for the transistor.

SUMMARY

Embodiments detailing a method of fabricating a hard mask structure are provided. According to the method, a hard mask layer is disposed over a substrate. The hard mask layer includes a lower hard mask layer disposed over the substrate and an upper hard mask layer disposed over the lower hard mask layer. The hard mask layer is patterned and the upper hard mask layer is removed by selectively etching the upper hard mask layer until reaching the lower hard mask layer to form a top portion of the hard mask structure having a first dimension. A spacer material is disposed on a side wall of the top portion of the hard mask structure. The lower hard mask layer is removed by selectively etching the lower mask layer until reaching the substrate to form a bottom portion of the hard mask structure having a second dimension.

Other embodiments provide a method of fabricating a semiconductor device. According to the method, a plurality of the hard mask structures separated from each other by a plurality of trenches is formed. The trenches are filled out with the spacer material so as to form a protective layer, wherein only a top surface of the hard mask structures is exposed. A mask layer over the protective layer is disposed, wherein the mask layer has an opening over an unwanted hard mask structure. The unwanted hard mask structure, the mask layer, and the spacer material from the trenches are subsequently removed. A portion of the substrate is removed by selectively etching the exposed areas of the substrate to form a base of the hard mask structure.

Yet other embodiments provide a hard mask structure including a top portion having a first dimension, and a bottom portion disposed under the top portion and having a second dimension, wherein the second dimension is greater than the first dimension.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

Reference is made below to the above-described drawings, which are not drawn to scale for ease of understanding, wherein the same reference numbers used throughout different figures designate the same or similar components.

DETAILED DESCRIPTION

Figure 1:
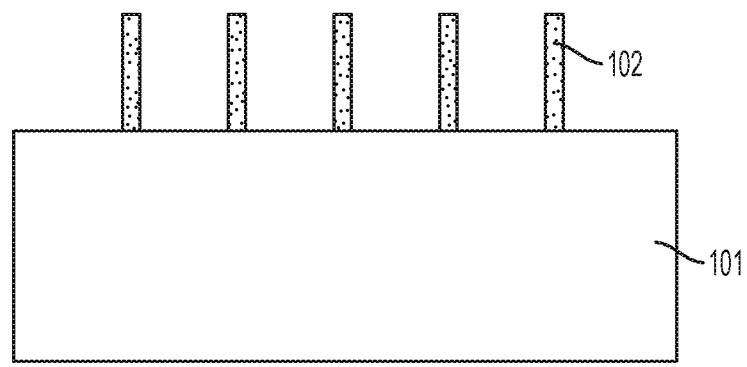
FIG. 1 is a cross-sectional view of a conventional hard mask structure disposed over a substrate.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e., one, two, three, four, etc. The terms "a plurality" are understood to include any integer number greater than or equal to two, i.e., two, three, four, five, etc. The term "connection" can include both an indirect "connection" and a direct "connection."

For the sake of brevity, conventional techniques related to semiconductor device and IC fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the present invention utilize a variety of individually known physical and chemical processes performed on a semiconductor (e.g., silicon) substrate, some of which are described in the following immediately following paragraphs.

In general, the various processes used to form a microchip that will be packaged into an IC fall into four general categories, namely, film deposition, removal/etching, semiconductor doping, and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE), and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Fundamental to the above-described fabrication processes is semiconductor lithography, i.e., the formation of three-dimensional relief images or patterns on the semiconductor substrate for subsequent transfer of the pattern to the substrate. In semiconductor lithography, the patterns are a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators, and selectively doped regions are built up to form the final device.

Aspects of the present invention and certain features, advantages, and details thereof, are explained more fully below with reference to the non-limiting embodiments illustrated in the accompanying drawings. Descriptions of well-known materials, fabrication tools, processing techniques, etc., are omitted so as to not unnecessarily obscure the invention in detail. It should be understood, however, that the detailed description and the specific examples, while indicating embodiments of the invention, are given by way of illustration only, and are not by way of limitation. Various substitutions, modifications, additions and/or arrangements within the spirit and/or scope of the underlying invention will be apparent to those skilled in the art from this description.

Turning now to a description of technologies that are more specifically relevant to embodiments of the present invention, Field effect transistors (FETs) are semiconductor devices fabricated on a bulk semiconductor substrate or on a silicon-on-insulator (SOI) substrate. FET devices generally consist of a source, a drain, a gate, and a channel between the source and drain. The gate is separated from the channel by a thin insulating layer, typically of silicon oxide, called the field or gate oxide. A voltage drop generated by the gate across the oxide layer induces a conducting channel between the source and drain thereby controlling the current flow between the source and the drain. Current integrated circuit designs use complementary metal-oxide-semiconductor (CMOS) technology that use complementary and symmetrical pairs of p-type and n-type metal oxide semiconductor field effect transistors (MOSFETs) for logic functions.

The integrated circuit industry is continually reducing the size of the devices, increasing the number of circuits that can be produced on a given substrate or chip. It is also desirable to increase the performance of these circuits, increase the speed, and reduce the power consumption. A three dimensional chip fabrication approach, such as a finFET, has been developed for semiconductor devices. A finFET is a non-planar FET. The "fin" is a narrow, vertical silicon based channel between the source and the drain. The fin is covered by the thin gate oxide and surrounded on two or three sides by an overlying gate structure. The multiple surfaces of the gate, allow for more effective suppression of "off-state" leakage current. The multiple surfaces of the gate also allow enhanced current in the "on" state, also known as drive current. These advantages translate to lower power consumption and enhanced device performance.

Process challenges exist as the dimensions of the devices decrease. Uniformity of the various layers of fabrication becomes more important as feature sizes are reduced, some now falling below 20 nm. Small variations in layer thickness have a larger impact on process variation and control. New process schemes are required to tolerate variations and maintain process control. Specifically, thick and stable fin hard masks are needed for Fin patterning, downstream chemical-mechanical polishing, and fin reveal.

Turning now to an overview of the present invention, one or more embodiments provide a method of fabricating a hard mask structure. According to the method, a hard mask layer is disposed over a substrate. The hard mask layer includes a lower hard mask layer disposed over the substrate and an upper hard mask layer disposed over the lower hard mask layer. The hard mask layer is patterned and the upper hard mask layer is removed by selectively etching the upper hard mask layer until reaching the lower hard mask layer to form a top portion of the hard mask structure having a first dimension. A spacer material is disposed on a side wall of the top portion of the hard mask structure. The lower hard mask layer is removed by selectively etching the lower mask layer until reaching the substrate to form a bottom portion of the hard mask structure having a second dimension.

Other embodiments provide a method of fabricating a semiconductor device. According to the method, a plurality of the hard mask structures separated from each other by a plurality of trenches is formed. The trenches are filled out with the spacer material so as to form a protective layer, wherein only a top surface of the hard mask structures is exposed. A mask layer over the protective layer is disposed, wherein the mask layer has an opening over an unwanted hard mask structure. The unwanted hard mask structure, the mask layer, and the spacer material from the trenches are subsequently removed. A portion of the substrate is removed by selectively etching the exposed areas of the substrate to form a base of the hard mask structure.

Yet other embodiments provide a hard mask structure including a top portion having a first dimension, and a bottom portion disposed under the top portion and having a second dimension, wherein the second dimension is greater than the first dimension.

The phrase "dimension" and variations thereof are used herein to identify dimensions of semiconductor device features that can impact the performance of the device (e.g., increase parasitic capacitance, etc.). Dimensions are often adjusted using a variety of means in order to optimize device performance and yield in manufacturing. The semiconductor features that are considered dimensions depend on a variety of factors, including, for example, the specifics of the relevant process technologies.

FIG. 1 shows a typical current hard mask disposed on a substrate 101, wherein individual structures 102 have uniform dimensions. It was found, however, that such a hard mask does not show good stability. As previously noted, thick and stable fin hard masks are needed for Fin patterning, downstream chemical-mechanical polishing, and fin reveal.

The inventors of the present application unexpectedly found that hard mask structures having two dimensions have improved stability and can be reliably used in a FinFET process.

Figure 2:
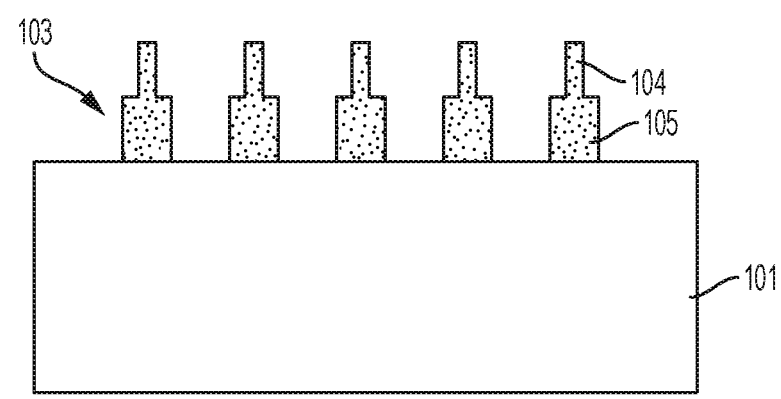
FIG. 2 is a cross-sectional view of the hard mask structure, according to an embodiment of the present invention.

FIG. 2 shows a hard mask structure 103, according to an embodiment of the present invention. The hard mask structure 103 is disposed on the substrate 101, which includes a top portion 104 having a first dimension, which in some embodiments can be a dimension, and a bottom portion 105 disposed under the top portion 104 and having a second dimension, which in some embodiments can be a dimension. In some embodiments, the second dimension is greater than the first dimension. In one or more embodiments, the first and/or second dimensions are a width of the corresponding portion of the hard mask structure measured from the point on the left hand side to the point on the right hand side of the structure.

Figure 3:
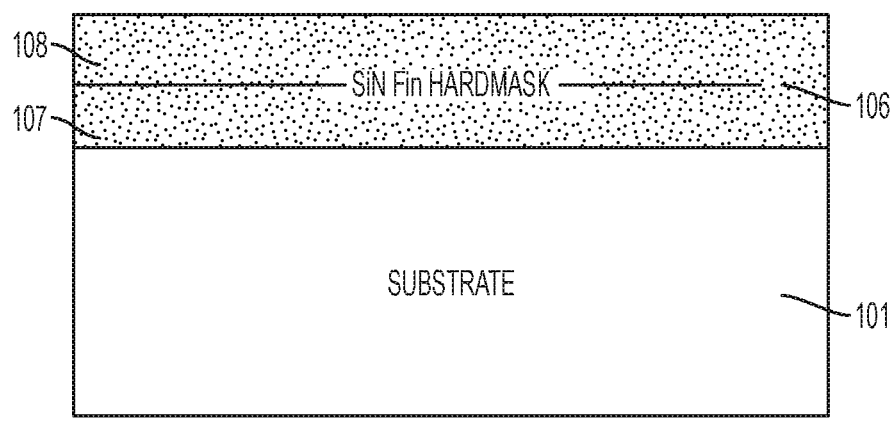
FIG. 3 is a cross-sectional view of the hard mask layer disposed over the substrate, according to an embodiment of the present invention.

Another embodiment provides a method of forming a hard mask structure. FIG. 3 illustrates a hard mask layer 106 disposed over the substrate 101. The hard mask layer 106 is used to define the substrate during the substrate etch process and can also protect the substrate during subsequent processing steps. For illustrative purposes, the thickness variations that can be present in the substrate 101 and the hard mask layer 106 have been exaggerated. In an embodiment, the hard mask layer 106 can include two layers: a first hard mask layer 107, deposited over the substrate 101 and a second hard mask layer 108, deposited over the first hard mask layer 107. The first hard mask layer 107 and the second hard mask layer 108 may include the same or different materials. In an embodiment, the first hard mask layer (or lower hard mask layer) 107, deposited over the substrate 101 can be manufactured of silicon nitride (SiN), deposited using, for example, low pressure chemical vapor deposition (LPCVD). In other embodiments, the first hard mask layer 107 materials can include, but are not limited to, hafnium oxide ($HfO_2$) or tantalum nitride (TaN). The first hard mask layer 107 disposed over the substrate 101 is a layer of sufficient thickness to protect the substrate 101 from damage during the removal of subsequent layers. It is also desirable to keep the first hard mask layer 107 sufficiently thin thereby reducing thickness variability and reducing the etch time required for subsequent removal, as will be discussed below. In an embodiment, the first hard mask layer 107 is about 10 nanometers to about 50 nanometers thick, for example, about 10 nanometers to about 30 nanometers thick, or about 30 nanometers thick, and is conformal to the top surface of the substrate 101.

The second hard mask layer 108 is deposited over the first hard mask layer 107. In an embodiment, the second hard mask layer (or upper hard mask layer) 108 can be the same material as the first hard mask layer 107, preferably SiN, deposited using, for example, LPCVD. Other second hard mask layer 108 materials can include, but are not limited to, hafnium oxide ($HfO_2$) or tantalum nitride (TaN). The second hard mask layer 108 can be of a sufficient thickness to protect the first hard mask layer 107 and the substrate 101 during subsequent processing steps described below. In an embodiment, the second hard mask layer 108 is about 10 nanometers to about 50 nanometers thick, for example, about 10 nanometers to about 30 nanometers thick, or about 30 nanometers thick. A person of ordinary skill in the art will recognize that chemical-mechanical planarization (CMP) steps can be inserted after the dielectric deposition processes to further planarize the surface. It should also be recognized that thickness variability caused by the CMP process will occur only in the second hard mask layer 108, and not in the first hard mask layer 107.

Figure 4:
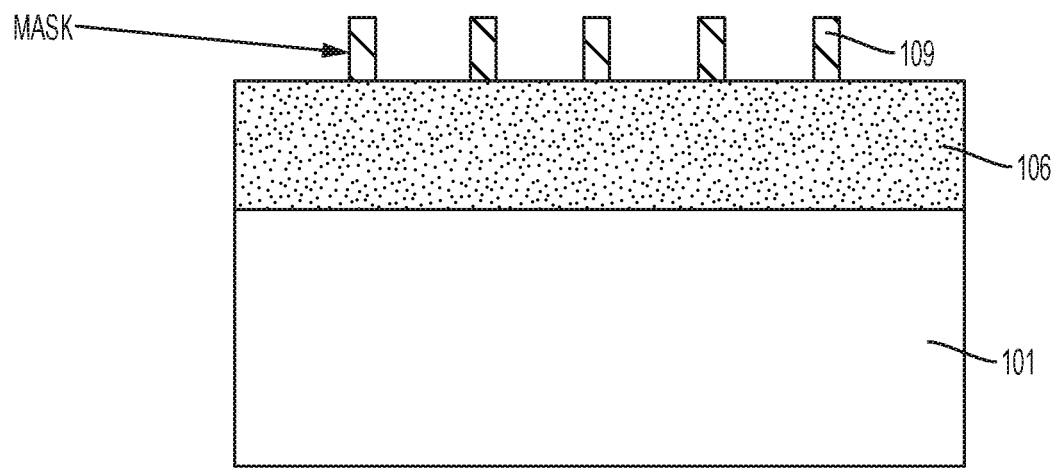
FIG. 4 is a cross-sectional view of the patterned hard mask, according to an embodiment of the present invention.

As shown in FIG. 4, the hard mask layer 106 can then be patterned to provide an etch mask 109. The patterning can be performed by Extreme Ultraviolet Lithography (EUV), Self-Aligned Double Patterning (SADP), or Self-Aligned Quadruple Patterning (SAQP). In an embodiment, standard photolithographic processes can be used to define the pattern of the etch mask 109 deposited over the second hard mask layer 108. The same pattern can then be formed in the second hard mask layer 108 by removing the second hard mask layer 108 from the areas not protected by the pattern.

Figure 5:
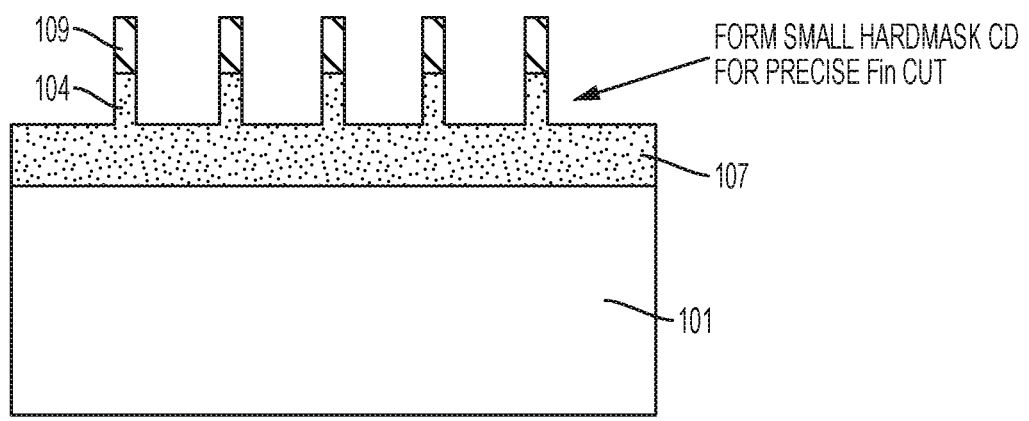
FIG. 5 illustrates a formation of the top portion of the hard mask structure having a first (smaller) dimension, according to an embodiment of the present invention.

The second hard mask layer 108 can be removed using, for example, an isotropic etching. In an embodiment, reactive ion etching (RIE) can be used to remove the second hard mask layer 108. This removal provides a top portion 104 of the hard mask structures 103 having the first dimension (FIG. 5). RIE uses chemically reactive plasma, generated by an electromagnetic field, to remove various materials. In an embodiment, the first dimension of the top portion of the hard mask structure may be from about 4 nanometers to about 8 nanometers. A person of ordinary skill in the art will recognize that the type of plasma used will depend on the material of which second hard mask layer 108 is composed, or that other etch processes, e.g., wet chemical etch, laser ablation, etc., can be used.

Figure 6:
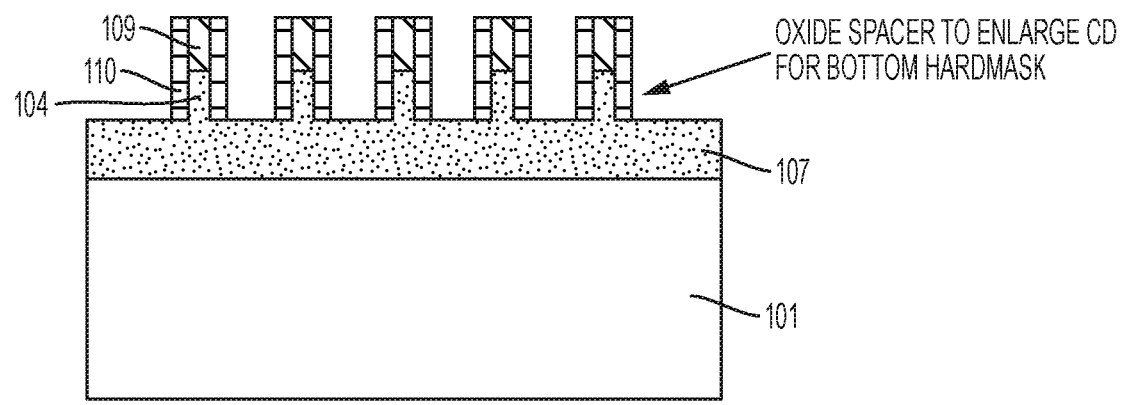
FIG. 6 illustrates deposition of the dielectric spacer, according to an embodiment of the present invention.

As shown in FIG. 6, a dielectric spacer 110 can be disposed over a sidewall of the top portion 104 of the hard mask structure 103 and over a sidewall of the etch mask 109 in order to enlarge the second dimension of the bottom portion 105 of the hard mask structure 103. The dielectric spacer can be any non-metal oxide spacer known in the art. For example, forming dielectric spacer 110 can include depositing a conformal layer (not shown) of insulating material, such as silicon nitride, over the sidewall of the top portion 104 of the hard mask structure 103 and over the sidewall of the etch mask 109. An anisotropic etch process, wherein the etch rate in the downward direction is greater than the etch rate in the lateral direction, can be used to remove the insulating layer, thereby forming dielectric spacer 110. The etch process can be controlled such that the insulating layer can be removed from the sidewall of the top portion 104 of the hard mask structure 103 and over the sidewall of the etch mask 109 while forming dielectric spacer 110.

Figure 7:
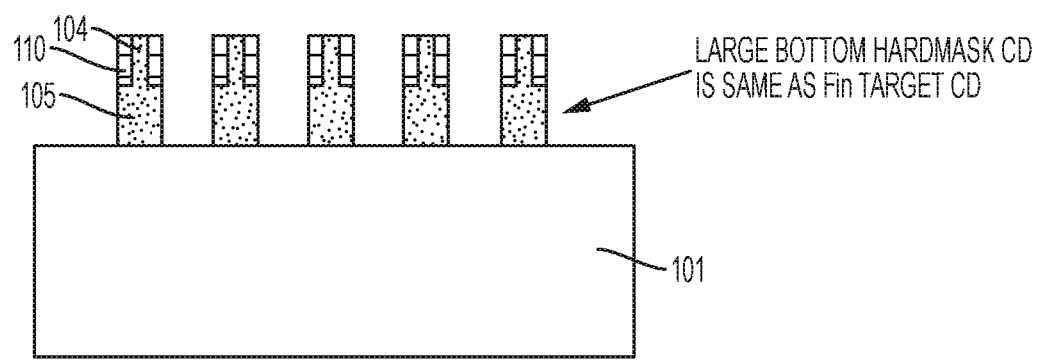
FIG. 7 illustrates formation of the bottom portion of the hard mask structure having a second (larger) dimension, according to an embodiment of the present invention.

The unmasked portion of the first hard mask layer 107 can then be selectively etched as defined by the position of the dielectric spacer 110 to provide the bottom portion 105 of the hard mask structure 103 having the second dimension. The removal of the first hard mask layer 107 can be performed by isotropic etching. In an embodiment, reactive ion etching (RIE) can be used to remove the first hard mask layer 107. RIE uses chemically reactive plasma, generated by an electromagnetic field, to remove various materials. In an embodiment, the second dimension of the bottom portion of the hard mask structure may be from about 8 nanometers to about 20 nanometers. A person of ordinary skill in the art will recognize that the type of plasma used will depend on the material of which first hard mask layer 107 is composed, or other etch processes, e.g., wet chemical etch, laser ablation, etc., can be used. During the process, the etch mask 109 can also be removed. As a result, a plurality of hard mask structures separated from each other by a plurality of trenches can be formed (FIG. 7).

Figure 8:
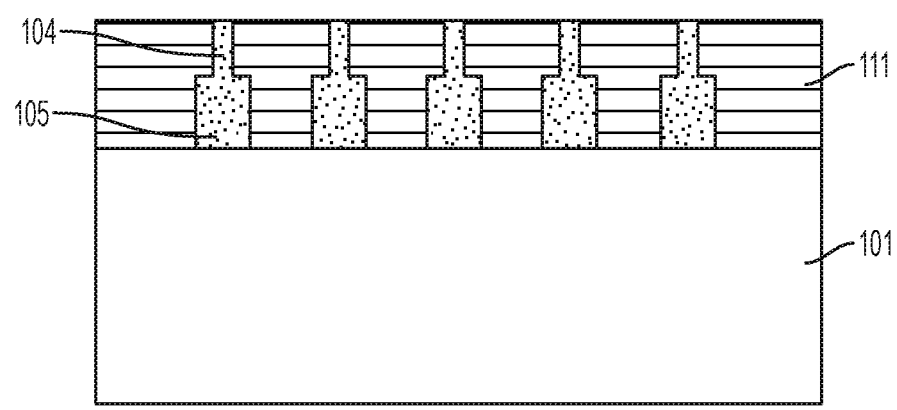
FIG. 8 illustrates formation of the protective layer by filling out the trenches between the hard mask structures with the spacer material, according to an embodiment of the present invention.
Figure 9:
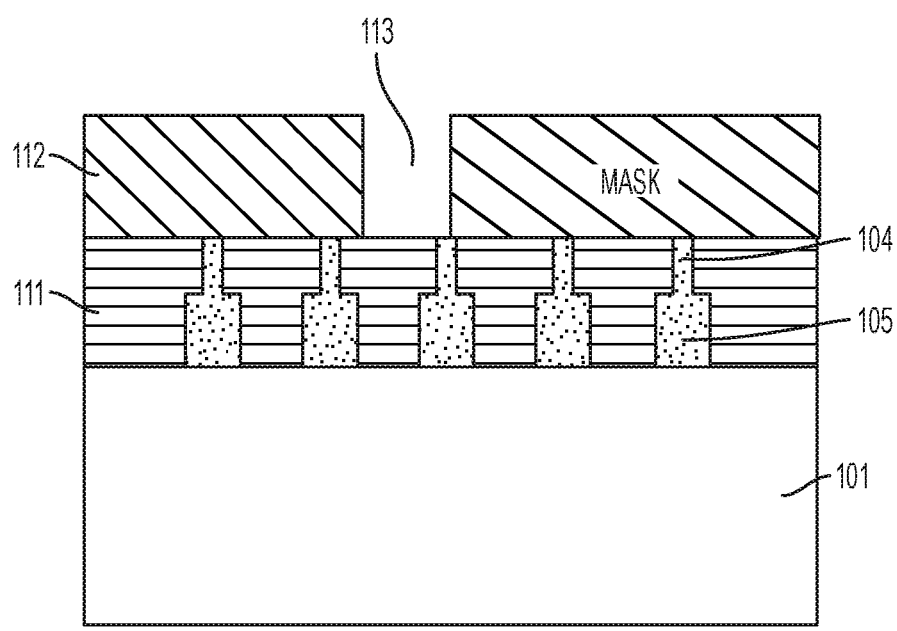
FIG. 9 illustrates deposition of the masking layer over the hard mask structures with an opening over the unwanted structure, according to an embodiment of the present invention.
Figure 10:
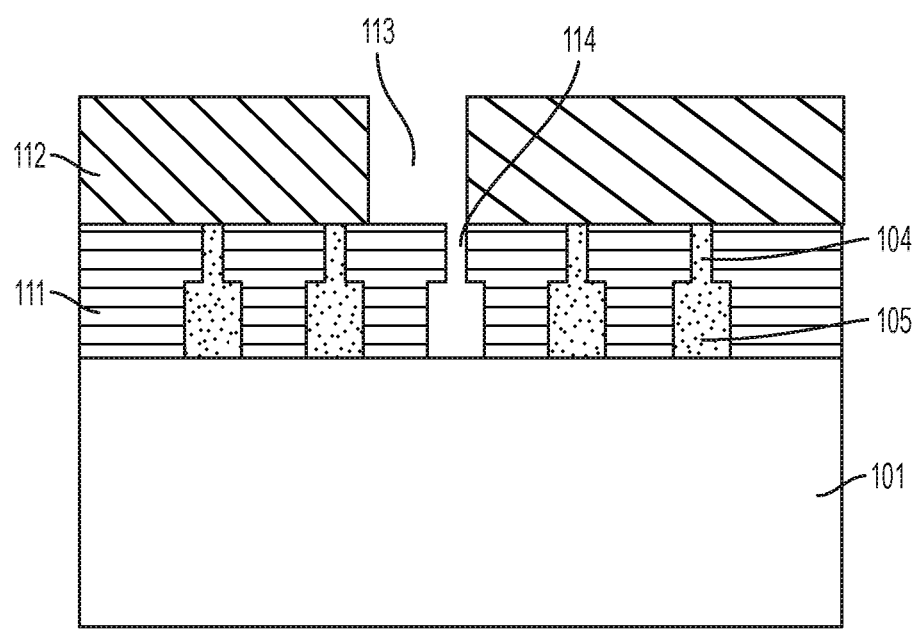
FIG. 10 illustrates removal of the unwanted hard mask structure by selective etching, according to an embodiment of the present invention.

The trenches can then be filled out with the spacer material 111 so as to form a protective layer, wherein only a top surface of the hard mask structures 103 is exposed. In an embodiment, the spacer material 111 can be the same as or different from the dielectric spacer 110 material (FIG. 8). A masking layer 112 can be disposed over the protective layer with an opening 113 over an unwanted hard mask structure 114 (FIG. 9). The unwanted hard mask structure 114 can be subsequently removed by dry or wet etching to leave a gap (void) 115 (FIG. 10).

Figure 11:
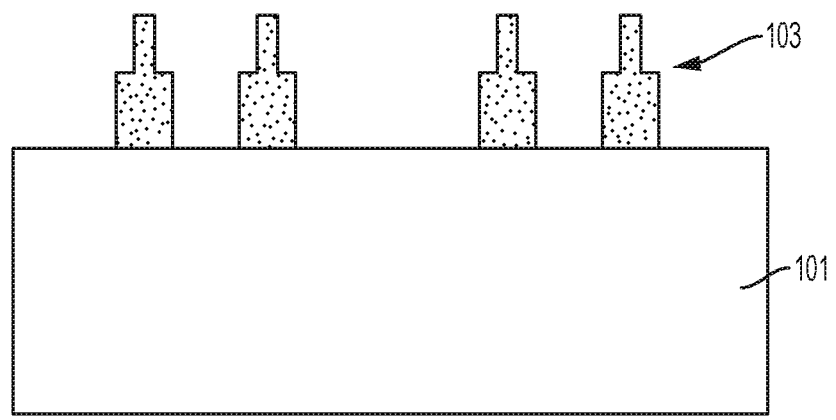
FIG. 11 illustrates a desired pattern of the hard mask structures disposed over the substrate, according to an embodiment of the present invention.
Figure 12:
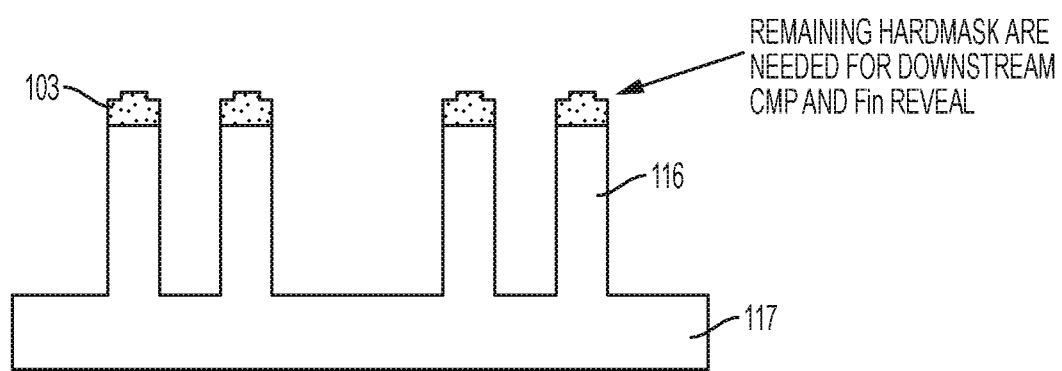
FIG. 12 illustrates a desired pattern of semiconductor fins, according to an embodiment of the present invention.

The masking layer 112 and the spacer material 111 can then be removed to provide a desired pattern of the hard mask structures 103 (FIG. 11). Subsequent etching of the substrate will furnish the desired fins 116 (FIG. 12) disposed on a bottom portion 117 of the substrate 101 (FIG. 13).

Although the invention has been shown and described with respect to certain embodiments, certain equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the described structure which performs the function in the herein illustrated exemplary embodiments of the invention. In addition, to the extent that a particular feature of the invention was described with respect to only one of several embodiments, such feature can be combined with one or more features of the other embodiments as desired for any given or particular application.

As used herein, the articles "a" and "an" preceding an element or component are intended to be nonrestrictive regarding the number of instances (i.e., occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variations can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It will also be understood that when an element, such as a layer, region, or substrate is referred to as being "on" or "over" another element, it can be directly on the other element or intervening elements can also be present. In contrast, when an element is referred to as being "directly on" or "directly over" another element, there are no intervening elements present, and the element is in contact with another element.

It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

What is claimed is:

1. A semiconductor device comprising:
   a substrate base extending along a first direction to define a width, a second direction opposite the first direction to define a length, and a third direction opposite the first and second directions to define a height;
   hard mask structures on the substrate base, the hard mask structures comprising:
      a top portion extending between opposing first and second top portion ends, the top portion including an etched top surface and having a first width dimension extending parallel to the first direction between the first and second top portion ends and having a first height dimension extending parallel to the third direction; and
      a bottom portion disposed on the substrate base and under the top portion, the bottom portion extending between first and second bottom portion ends that define a second width dimension that extends parallel to the first direction and that is greater than the first width dimension of the top portion, and a second height dimension extending parallel to the third direction, the second height dimension being greater than the first height dimension; and
      spacer material filling trenches separating the hard mask structures from each other,
   wherein the etched top surface stops at the first top portion end without reaching the first bottom portion end and stops at the second top portion end without reaching the second bottom portion end, and
   wherein the bottom portion is configured to define a width of a fin cut into the substrate base.

2. The semiconductor device of claim 1, wherein the first dimension is a first width extending parallel with an upper surface of the substrate base.

3. The semiconductor device of claim 2, wherein the second dimension is a second width extending parallel with the upper surface of the substrate base.

4. The semiconductor device according to claim 3, wherein the hard mask structures comprises silicon nitride (SiN).

5. The semiconductor device according to claim 3, wherein the hard mask structures comprises hafnium oxide (HfO2).

6. The semiconductor device according to claim 3, wherein the hard mask structures comprises tantalum nitride (TaN).

7. A semiconductor device comprising:
   hard mask structures comprising:
      a top portion extending between opposing first and second top portion ends, the top portion including an etched top surface and extending along a horizontal direction between first and second top portion ends to define a first width dimension and a vertical direction opposite the horizontal direction to define a first height dimension; and
      a bottom portion disposed under the top portion and extending along a second horizontal direction between first and second bottom portion ends to define a second width dimension and a second vertical direction to define a second height dimension, the second height dimension being greater than the first height dimension; and
      a substrate base disposed under the bottom portion of the hard mask structures,
   wherein the etched top surface stops at the first top portion end without reaching the first bottom portion end and stops at the second top portion end without reaching the second bottom portion end, and
   wherein the bottom portion is configured to define a width of a fin cut into the substrate base.

8. The semiconductor device of claim 7, wherein the first width dimension extends parallel with an upper surface of the substrate base.

9. The semiconductor device of claim 8, wherein the second width dimension extends parallel with the upper surface of the substrate base.

10. The semiconductor device of claim 9, wherein the second width dimension is greater than the first width dimension.

11. The semiconductor device according to claim 10, wherein the hard mask structures comprises silicon nitride (SiN).

12. The semiconductor device according to claim 10, wherein the hard mask structures comprises hafnium oxide (HfO2).

13. The semiconductor device according to claim 10, wherein the hard mask structures comprises tantalum nitride (TaN).

* * * * *